United States Patent
Joo

(10) Patent No.: US 8,004,896 B2
(45) Date of Patent: Aug. 23, 2011

(54) METHOD OF CONTROLLING OPERATION OF FLASH MEMORY DEVICE

(75) Inventor: Seok Jin Joo, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 121 days.

(21) Appl. No.: 12/493,604

(22) Filed: Jun. 29, 2009

(65) Prior Publication Data

US 2010/0034021 A1     Feb. 11, 2010

(30) Foreign Application Priority Data

Aug. 5, 2008   (KR) .................. 10-2008-0076373

(51) Int. Cl.
   *G11C 11/34*     (2006.01)
(52) U.S. Cl. .......... 365/185.11; 365/185.2; 365/185.19; 365/185.24; 365/185.12
(58) Field of Classification Search ............ 365/185.11, 365/185.2, 185.19, 185.24
   See application file for complete search history.

(56) References Cited

U.S. PATENT DOCUMENTS 5,596,526 A * 1/1997 Assar et al. .............. 365/185.17

FOREIGN PATENT DOCUMENTS

| KR | 100773400 B1 | 10/2007 |
| KR | 1020080070463 A | 7/2008 |
| KR | 10-0894787 | 4/2009 |

OTHER PUBLICATIONS

Notice of Preliminary Rejection issued from Korean Intellectual Property Office on Jan. 29, 2010.

* cited by examiner

*Primary Examiner* — Thong Q Le
(74) *Attorney, Agent, or Firm* — IP & T Group LLP

(57) ABSTRACT

According to a method of controlling the operation of a flash memory device including a number of memory blocks, a memory block of the memory blocks is first selected as a reference block. A program operation is performed on a memory cell included in the reference block. In order to check an operating characteristic of the reference block, a threshold voltage level of the programmed memory cell is read. Parameters for performing an operation of the flash memory device are determined based on the operating characteristic of the reference block. The parameters are stored in the reference block.

11 Claims, 5 Drawing Sheets

METHOD OF CONTROLLING OPERATION OF FLASH MEMORY DEVICE

CROSS-REFERENCE TO RELATED APPLICATION

Priority to Korean patent application number 10-2008-0076373 filed on Aug. 5, 2008, the entire disclosure of which is incorporated by reference herein, is claimed.

BACKGROUND

One or more embodiments relate to a method of controlling an operation of a flash memory device and, more particularly, to a method of controlling an operation of a flash memory device, which is capable of efficiently controlling a memory cell having a shifted threshold voltage after repetitive program and erase operations are performed.

In recent years, there is an increasing demand for nonvolatile memory devices which can be electrically programmed and erased and do not require the refresh function of rewriting data at specific intervals. In order to develop large capacity memory devices capable of storing a lot of data, active research is being carried out on technologies for the high degree of integration of memory devices. Here, a program operation refers to an operation of writing data into a memory cell, and an erase operation refers to an operation of erasing data written into a memory cell.

For the high degree of integration of memory devices, a NAND flash memory device in which a number of memory cells are coupled in series (i.e., a structure in which a drain or a source is shared by neighboring cells), thereby constituting one string, has been developed. The NAND flash memory device is a memory device configured to sequentially read data unlike a NOR flash memory device. The program and erase operations of this NAND flash memory device are performed by controlling the threshold voltage Vt of a memory cell while electrons are injected into or discharged from a floating gate using the F-N tunneling.

In the NAND flash memory device, it is important to secure the reliability of a memory cell. In particular, the data retention characteristic of a memory cell is emerging as an important problem. As described above, however, the program and erase operations of the NAND flash memory device are performed using the F-N tunneling method. During the repetitive F-N tunneling processes, electrons are trapped at the tunnel oxide layer of a memory cell and the threshold voltage of the memory cell shifts. Accordingly, when data is read, data stored in an original memory cell is erroneously read. That is, reliability of the memory cell is deteriorated.

A shift in the threshold voltage of the memory cell is generated by the electrons trapped at the tunnel oxide layer resulting from the repetitive F-N tunneling process according to program cycles. The term 'program cycles' refers to a process of repetitively performing the program operation and the erase operation. In order to prevent a shift in the threshold voltage of the memory cell, a method of sufficiently reducing an erase voltage to a verification voltage or less by controlling a bias condition (i.e., a bias voltage) during the program operation and the erase operation is used. In this method, however, the threshold voltage shifts because it is increased by as much as an increased bias voltage. Another method of preventing a shift in the threshold voltage of the memory cell is to reduce the amount of electrons trapped upon F-N tunneling by reducing the thickness of the tunnel oxide layer. However, the method of reducing the thickness of the tunnel oxide layer is limited due to the data retention characteristic problem or a read disturbance problem.

Prior to the method of reducing a shift in the threshold voltage of the memory cell, it is very important to monitor a shift in the threshold voltage of the memory cell. In general, in the case of a 1-bit cell, the threshold voltage of a memory cell becomes positive in a program state, and the threshold voltage of a memory cell becomes negative in an erase state. However, in a 2- to 4-bit multi-level cell (MLC) in which the distributions of a threshold voltage of a memory cell are further subdivided in order to store a greater amount of data in a single memory cell, threshold voltage distribution margin tends to abruptly decrease. In the case where a threshold voltage distribution of the memory cell is changed by program cycles as compared with its initial stage, if a conventional fixed read voltage level is continuously used, data stored in the memory cell is more likely to be erroneously read.

This issue may also occur in a program operation. The program operation for a memory cell may be performed using an incremental step pulse program (ISPP) method. In this ISPP method, when a program operation is performed, voltage applied to a memory cell begins from a start bias and is stepped up as much as a specific step bias. If a program operation is performed using this ISPP method, an over-program problem can be prevented. However, if the threshold voltage of a memory cell rises because of a shift according to program cycles, the over-program problem can be generated although the ISPP method is used.

It is therefore important to monitor a shift in the threshold voltage of a memory cell prior to a method of reducing a shift in the threshold voltage of the memory cell.

BRIEF SUMMARY

According to one or more embodiments, when a read or program operation for a flash memory device is performed, a shift in the threshold voltage of a memory cell is monitored using a reference block, and a read voltage, an ISPP initial bias, and an ISPP step bias are changed based on the monitoring result.

According to a method of controlling the operation of a flash memory device including a number of memory blocks, a memory block of the memory blocks is first selected as a reference block. A program operation is performed on a memory cell included in the reference block. In order to check an operating characteristic of the reference block, a threshold voltage level of the programmed memory cell is read. At least one parameter for performing the operation of the flash memory device is determined based on the operating characteristic of the reference block. The parameters are stored in the reference block.

The at least one parameter may include a start voltage and a step voltage for performing an Incremental Step Pulse Program (ISPP) operation, a program verification voltage, and a read voltage for performing a read operation.

The determination of the ISPP step voltage of the least one parameter may include setting a preliminary read voltage to be lower than a read voltage used in a read operation, counting a number of memory cells, each having a threshold voltage lower than the preliminary read voltage, by reading the memory cells on the basis of the preliminary read voltage, and if the number of memory cells each having the threshold voltage lower than the preliminary read voltage is reduced as compared with an initial program cycle operation due to widening of a threshold voltage distribution with repetition of program cycle operations, reducing the ISPP step voltage value. The ISPP step voltage value may be reduced by 0.05 V.

The determination of the ISPP step voltage of the at least one parameter may include setting a preliminary read voltage to be lower than a read voltage used in a read operation, counting a number of memory cells, each having a threshold voltage lower than the preliminary read voltage, by reading the memory cells on the basis of the preliminary read voltage, and if the number of memory cells each having the threshold voltage lower than the preliminary read voltage is reduced as compared with an initial program cycle operation due to widening of a threshold voltage distribution with repetition of program cycle operations, reducing the ISPP start voltage value.

When the flash memory device is in an idle time, the reference block may be selected. The reference block may be selected using a wear level control method. The parameters may be stored in a last page of the reference block.

A method of controlling an operation of a flash memory device according to another embodiment includes storing parameters in a control unit, wherein the parameters are determined based on an operating characteristic of a reference block included in the flash memory device and are stored in the reference block, and performing a program or read operation on the flash memory device using the parameters stored in the control unit.

When the number of program cycles for the flash memory device is 100 times, the parameters may be stored in the control unit. When the flash memory device is rebooted, the parameters may be stored in the control unit.

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of the embodiments of the disclosure.

Figure 1:
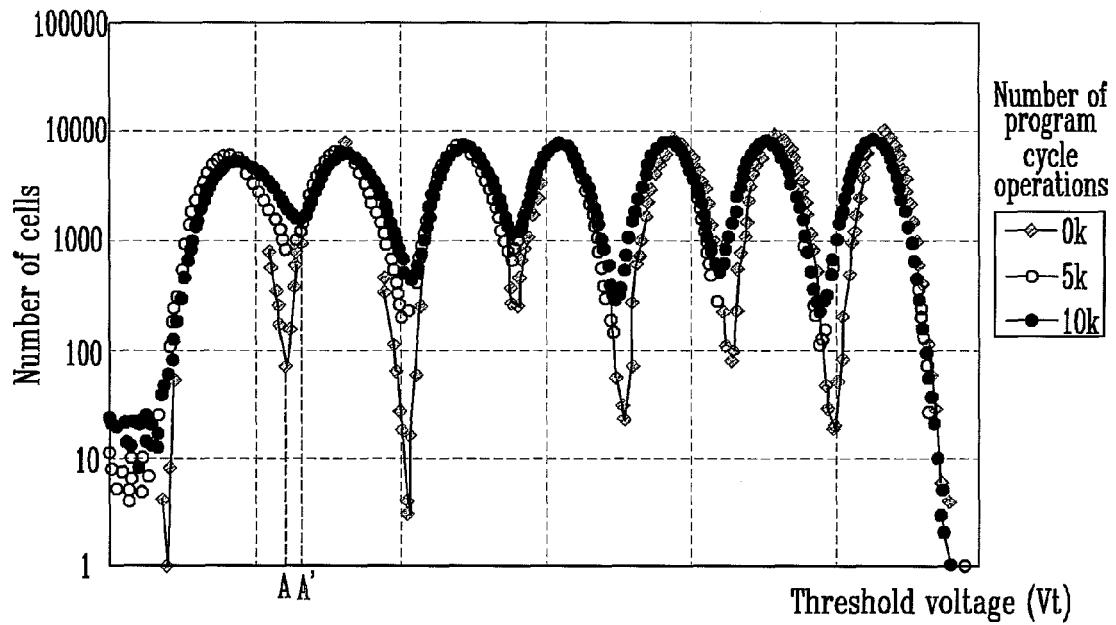
FIG. 1 is a diagram showing the distributions of a threshold voltage according to the number of program cycles in a 3-bit MLC.

FIG. 1 is a diagram showing the distributions of a threshold voltage according to the number of program cycles in a 3-bit MLC.

Referring to FIG. 1, a 3-bit MLC requires eight threshold voltage levels in order to represent 3 bits (i.e., data size of 2 to the third power). The threshold voltage has to be distributed into eight voltage levels each within a voltage range of, typically, 5 to 6 V because in voltage increase, the maximum value of a program verification voltage level is limited due to reasons, such as program disturbance. Accordingly, neighboring threshold voltage levels may overlap with each other because a distance between the threshold voltage levels is very narrow. In this case, an error correction code (ECC) processing must be performed. Furthermore, the ECC processing has a limit, and this problem may worsen in a four-bit or more MLC.

In order to solve the problem, it is important to search for a point where threshold voltage distributions overlap with each other at a minimum level, set the point as a read voltage level, and perform a read operation based on the read voltage level. Here, the point where the threshold voltage distributions overlap with each other at a minimum level gradually moves according to the progress of program cycles (for example, a movement from a point A to a point A' in FIG. 1). Accordingly, if a fixed read voltage level is used as described above, data stored in a memory cell may be erroneously read according to the progress of program cycles.

Figure 2:
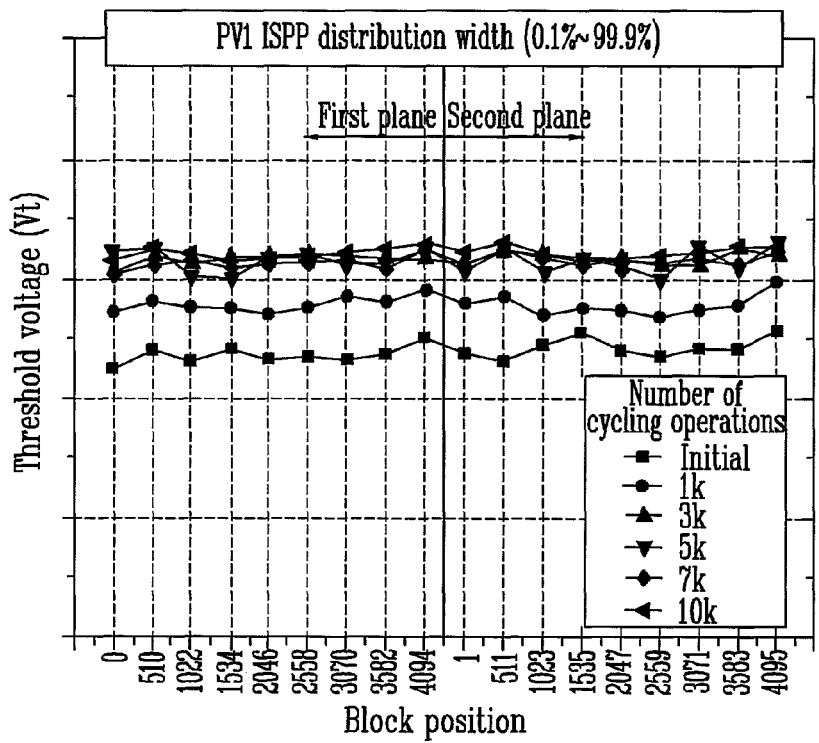
FIG. 2 is a diagram showing the width of threshold voltage distributions according to the number of program cycles of blocks included in each of planes arranged in a flash memory device.

FIG. 2 is a diagram showing the width of threshold voltage distributions according to the number of program cycles of blocks included in each of planes arranged in a flash memory device.

Referring to FIG. 2, blocks on which program cycles has been performed for the same number of times generally have a similar threshold voltage distribution width irrespective of their positions. That is, the threshold voltage distribution characteristic of blocks within the same flash memory device is dependent on the number of program cycles performed on each block rather than their positions within the blocks. As described above, the threshold voltage distribution characteristic of a block dependent on the number of program cycles may become more uniform through wear level control which is performed to control the number of program cycles for each of blocks, belonging to the same flash memory device, to be uniform.

As described above, since a threshold voltage distribution characteristic that shifts according to the progress of program cycles is similar within blocks belonging to the same flash memory device, a specific one of the blocks can represent the characteristics of the remaining blocks. A specific one of the blocks belonging to the same flash memory device may be selected as a reference block, the reference block may be programmed, and a shift in the threshold voltage of the reference block may be monitored. Accordingly, the threshold voltage characteristic of the blocks belonging to the same flash memory device can be determined on the basis of the reference block. This is described in more detail below.

Figure 3:
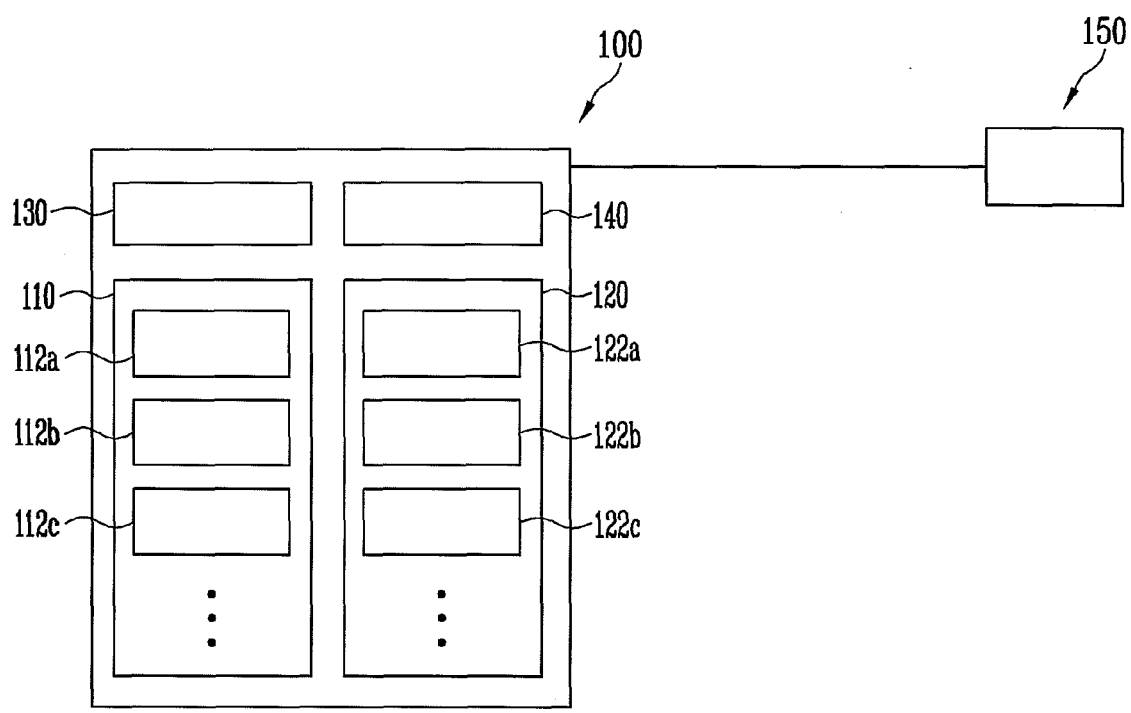
FIG. 3 is a block diagram of a flash memory device shown to describe a method of controlling an operation of the flash memory device according to an embodiment.

FIG. 3 is a block diagram of a flash memory device shown to describe a method of controlling an operation of the flash memory device according to an embodiment.

Referring to FIG. 3, the flash memory device 100 according to the embodiment includes a first plane 110, a second plane 120, a first page buffer unit 130, and a second page buffer unit 140.

The first plane 110 and the second plane 120 include a number of blocks 112a to 112c and a number of blocks 122a to 122c, respectively. Each of the blocks 112a to 112c and 122a to 122c includes a number of memory cells coupled via word lines and bit lines. A group of the memory cells having gates coupled to a single word line is called a page (not shown).

The first page buffer unit 130 and the second page buffer unit 140 are respectively coupled to the first plane 110 and the second plane 120, in particular, the respective bit lines of the first plane 110 and the second plane 120. Each of the first page buffer unit 130 and the second page buffer unit 140 supplies a specific voltage to a memory cell, coupled to a bit line selected for a program or read operation.

The flash memory device 100 constructed as above is controlled using a control unit 150. The control unit 150 can perform the program, read, and erase operations of the flash memory device 100 and also store the number of program cycle operations (i.e., the program and read operations of the flash memory device 100). Further, the control unit 150 may function to prevent error, occurring due to a shift in the threshold voltage distribution of the flash memory device 100 when the flash memory device 100 repetitively performs program cycle operations, during the program or read operation of the flash memory device 100. To this end, the control unit 150 may variably set parameters (for example, a start voltage and a step voltage necessary for an ISPP operation, a program verification voltage, and a read voltage necessary for a read operation), used in the program or read operation of the flash memory device 100, according to a shift in the threshold voltage distribution of the flash memory device 100. This is described in more detail below.

Figure 4:
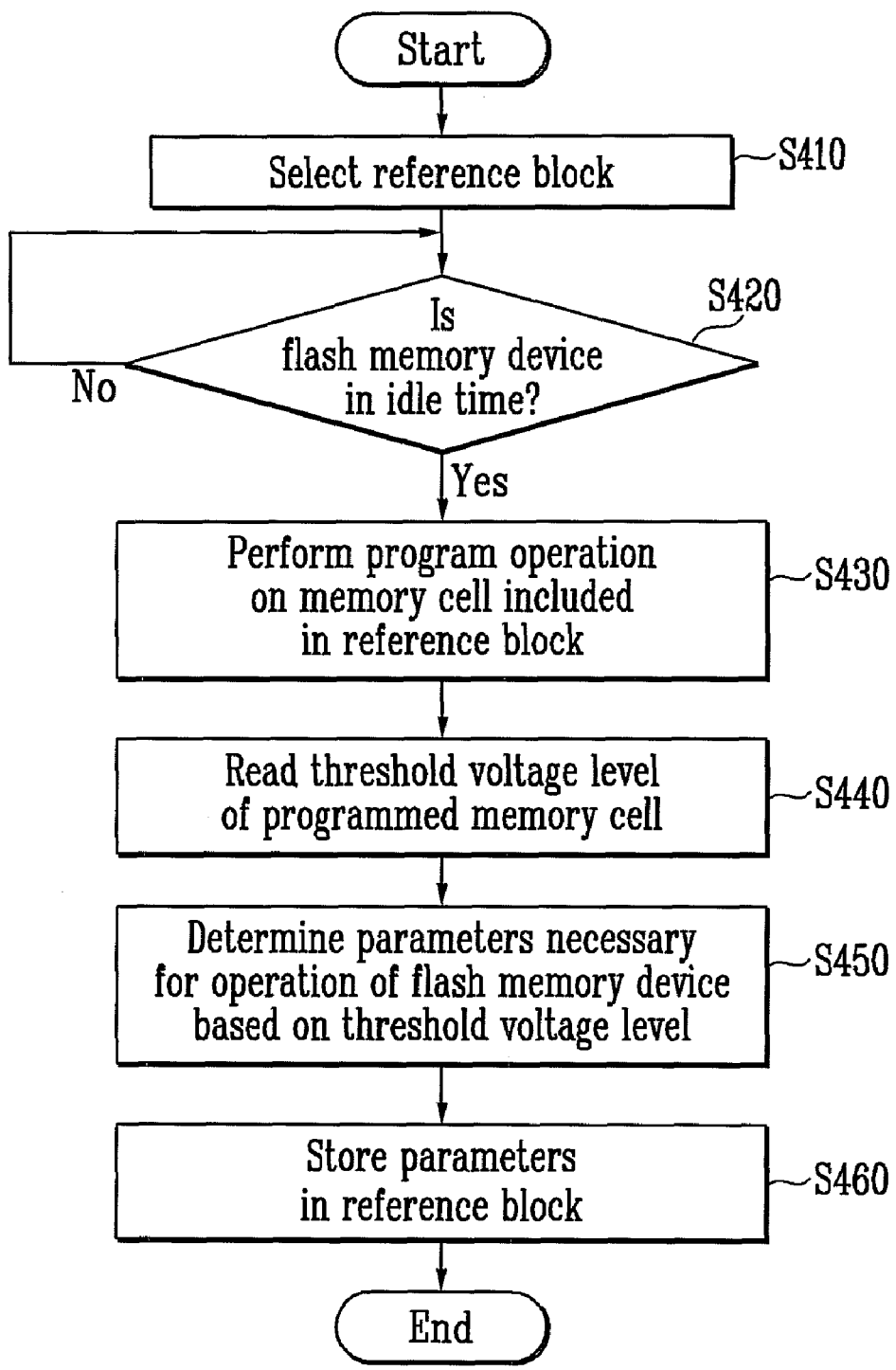
FIG. 4 is a flowchart illustrating a method of controlling an operation of the flash memory device according to an embodiment.

FIG. 4 is a flowchart illustrating a method of controlling an operation of the flash memory device according to an embodiment.

Referring to FIGS. 3 and 4, any one of the blocks 112a to 112c or 122a to 122c of the flash memory device 100 is set as a reference block at step S410. As described above, the blocks 112a to 112c or 122a to 122c have a similar threshold voltage shift characteristic irrespective of their positions arranged in the flash memory device 100. Accordingly, any one of the blocks 112a to 112c or 122a to 122c of the flash memory device 100 may represent the threshold voltage characteristic of all the blocks, shifting with the repetition of the program cycle operations. A different one of the blocks within the flash memory device 100 may be selected as the reference block using the wear level control method so that the blocks are selected with a similar frequency. Alternatively, a specific block may be selected as the reference block, and any block selected through the wear level control method may be set to have a similar threshold voltage characteristic to the specific block by performing a program cycles operation (i.e., the program and read operations).

Next, the control unit 150 determines whether the flash memory device 100 is in an idle time at step S420. If, as a result of the determination, the flash memory device 100 is determined to be in the idle time, the control unit 150 performs a program operation on a memory cell included in the reference block at step S430. In this case, data programmed into the reference block may include random data. Further, cells having the same number of thresholds are preferably programmed based on respective threshold voltage levels. For example, a 2-bit MLC includes four threshold voltage levels. Here, cells having the same number of thresholds are programmed based on respective threshold voltage levels.

In order to check the operating characteristic of the reference block, the threshold voltage level of the programmed memory cell is read at step S440. Parameters necessary for the operation of the flash memory device 100 are then determined based on the operating characteristic of the reference block at step S450. The parameters may include an ISPP step voltage, an ISPP start voltage, a program verification voltage, and a read voltage when a program operation is performed using the ISPP method. This is described in more detail below.

Figure 6:
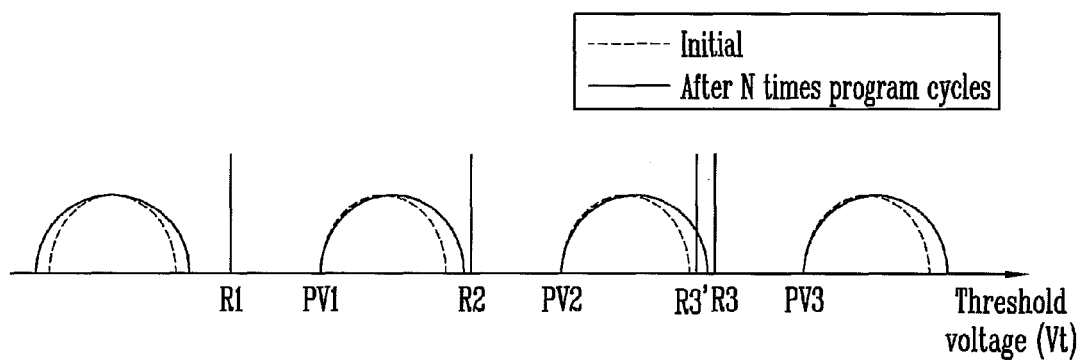
FIGS. 6 and 7 are graphs showing threshold voltages before and after program cycles in a reference block (i.e., a 2-bit MLC).
Figure 7:
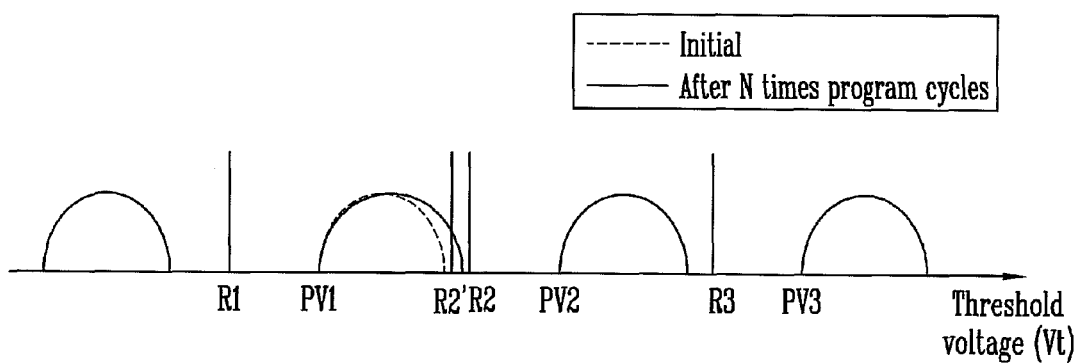

FIGS. 6 and 7 are graphs showing threshold voltages before and after program cycles in a reference block (i.e., a 2-bit MLC).

Referring to FIG. 6, with the repetition of program cycles operations, the threshold voltage distribution of each level may have a gradually wider width. In this case, after a preliminary read voltage R3' that is about 0.1 V lower than a read voltage R3 used in the read operation is set, the number of memory cells, each having a threshold voltage lower than the preliminary read voltage R3', is counted by reading the memory cells on the basis of the preliminary read voltage R3'. Accordingly, in the case where the number of memory cells each having a threshold voltage lower than the preliminary read voltage R3' is reduced as compared with an initial program cycles operation because the threshold voltage distribution is widened with the repetition of the program cycles operations, if a step voltage value when a program operation is performed is reduced using an ISPP method, the threshold voltage distribution width can be reduced again. For example, in the case where the step voltage value is set to 0.3 V, the step voltage value is preferably lowered to 0.25 V or 0.2 V by 0.05 V.

Referring to FIG. 7, when program cycles operations are repeated, the program speed becomes fast. At this time, if a start voltage is not sufficiently low when the program cycles operations are performed using an ISPP method, only the threshold voltage distribution of a verification voltage PV1 (i.e., a specific level) can be widened. In this case, after a preliminary read voltage R2' that is about 0.1 V lower than a read voltage R2 used in the read operation is set, the number of memory cells, each having a threshold voltage lower than the preliminary read voltage R2', is counted by reading the memory cells on the basis of the preliminary read voltage R2'. Accordingly, in the case where the number of memory cells each having a threshold voltage lower than the preliminary read voltage R2' is reduced as compared with an initial program cycles operation because the threshold voltage distribution of a verification voltage PV1 (i.e., a specific level) is widened with the repetition of the program cycles operations, if a start voltage value when a program operation is performed is reduced using an ISPP method, the threshold voltage distribution width can be reduced again. In this case, the start voltage value can be reduced as much as a step voltage when the program operation is performed using the ISPP method.

As described above, the threshold voltage characteristic of a block, shifting with the repetition of program cycles operations, is checked through a reference block. Accordingly, parameters, such as a step voltage and a start voltage, when an ISPP operation is performed can be detected optimally.

In the past, the parameter values were fixed. However, the threshold voltage of a memory cell included in a block shifts with the repetition of program cycles operations for a flash memory device. Accordingly, it is preferred that parameters which are initially set and fixed are changed in accordance with a shift in the threshold voltage.

Referring back to FIG. 4, the parameters detected through the reference block are stored in the page of the reference block at step S460. The parameters may be preferably stored in the last page of the reference block.

Figure 5:
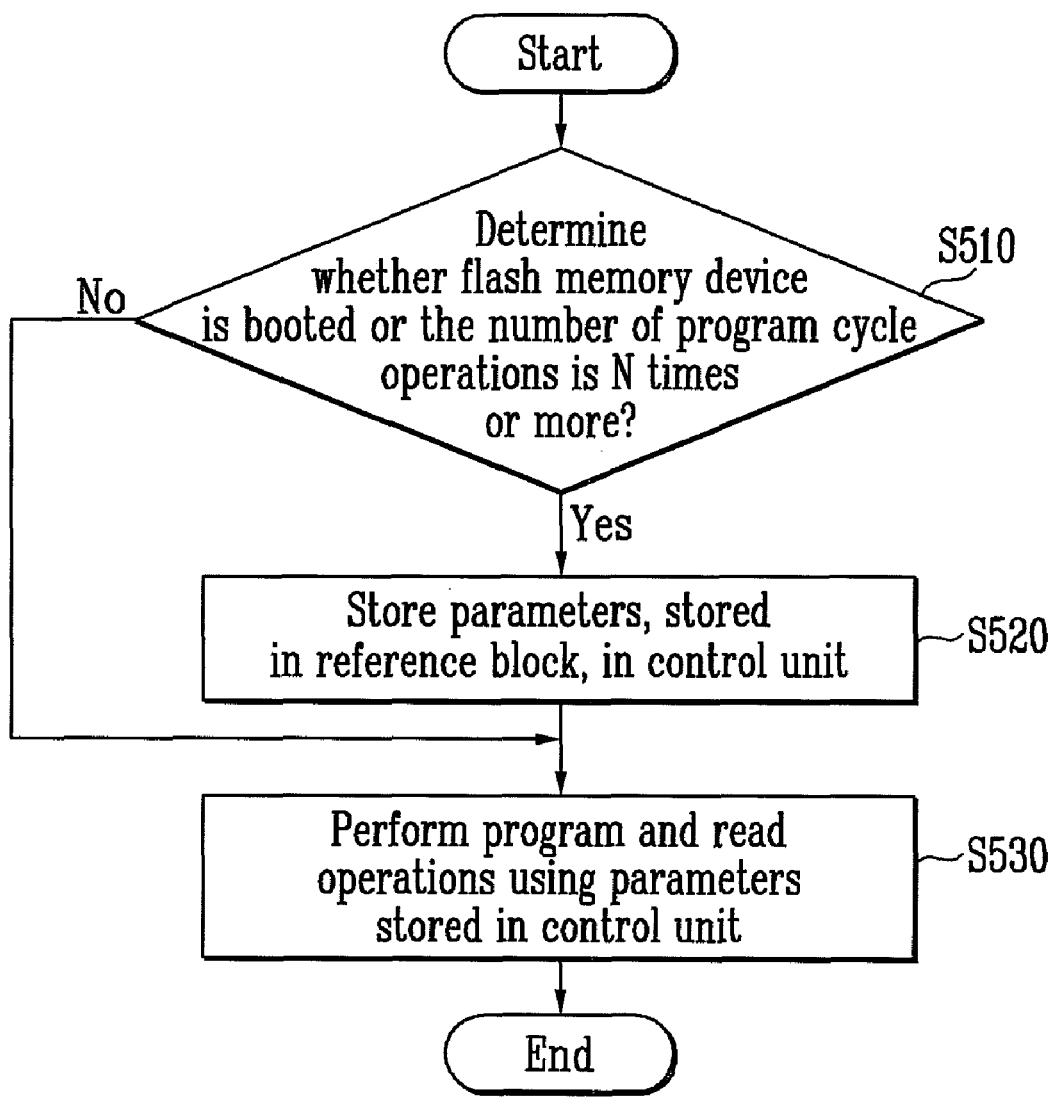
FIG. 5 is a second flowchart illustrating a method of controlling an operation of the flash memory device according to another embodiment.

FIG. 5 is a second flowchart illustrating a method of controlling an operation of the flash memory device according to another embodiment.

Referring to FIGS. 3 and 5, when the flash memory device is programmed, it is first determined whether the flash memory device 100 is rebooted or the number of program cycles operations of the flash memory device 100 is a specific frequency or more (for example, 100 times or more) at step S510. Parameters stored in the control unit 150 are updated to parameters stored in the last page of a reference block at step S520. In this case, when the flash memory device 100 is first operated, the parameters stored in the control unit 150 may include initially set parameters with consideration taken of margin, etc. when the flash memory device is fabricated.

In this case, the number of program cycles determined in order to update the parameters stored in the control unit 150 may be set when a data program or a read operation is difficult to perform using a conventional parameter value because a threshold voltage distribution has shifted with the repetition of program cycles operations for a block. The parameter values do not occupy a large memory capacity of the control unit 150 because they have a data size less than 20 bytes.

Thus, proper parameter values corresponding to a threshold voltage, shifting with the progress of a program cycles operation, are continuously updated in the control unit 150, and the parameter values stored in the control unit 150 can be used when the flash memory device performs program and read operations.

According to the method of controlling an operation of the flash memory device, although the threshold voltage of a block shifts, a flash memory device can be controlled based on optimal parameter values. Accordingly, reliability can be further enhanced.

What is claimed is:

1. A method of controlling an operation of a flash memory device, the method comprising:
   selecting a memory block of a number of memory blocks of a flash memory device as a reference block;
   performing a program operation on a memory cell included in the reference block;
   reading a threshold voltage level of the programmed memory cell in order to check an operating characteristic of the reference block;
   determining at least one parameter for an operation of the flash memory device based on the operating characteristic of the reference block; and
   storing the at least one parameter in the reference block.

2. The method of claim 1, wherein the at least one parameter comprises one of a start voltage and a step voltage for performing an Incremental Step Pulse Program (ISPP) operation, a program verification voltage, and a read voltage for performing a read operation.

3. The method of claim 2, wherein the determination of the ISPP step voltage of one of the at least one parameter comprises:
   setting a preliminary read voltage to be lower than a read voltage used in a read operation;
   counting a number of memory cells, each having a threshold voltage lower than the preliminary read voltage, by reading the memory cells on the basis of the preliminary read voltage; and
   reducing the ISPP step voltage value when the number of memory cells each having the threshold voltage lower than the preliminary read voltage is reduced as compared with an initial program cycle operation due to widening of a threshold voltage distribution with repetition of program cycle operations.

4. The method of claim 3, wherein the ISPP step voltage value is reduced by 0.05 V.

5. The method of claim 2, wherein the determination of the ISPP step voltage of the at least one parameter comprises:
   setting a preliminary read voltage to be lower than a read voltage used in a read operation;
   counting a number of memory cells, each having a threshold voltage lower than the preliminary read voltage, by reading the memory cells on the basis of the preliminary read voltage; and
   reducing the ISPP start voltage value when the number of memory cells each having the threshold voltage lower than the preliminary read voltage is reduced as compared with an initial program cycle operation due to widening of a threshold voltage distribution with repetition of program cycle operations.

6. The method of claim 1, wherein when the flash memory device is in an idle time, the reference block is selected.

7. The method of claim 1, wherein the reference block is selected using a wear level control method.

8. The method of claim 1, wherein the parameters are stored in a last page of the reference block.

9. The method of claim 1, further comprising:
   storing parameters in a control unit, wherein the parameters stored in the control unit are determined based on an operating characteristic of a reference block included in the flash memory device and are stored in the same reference block; and
   performing a program or read operation on the flash memory device using the parameters stored in the control unit.

10. The method of claim 9, wherein when a number of program cycles for the flash memory device are 100 times, the parameters are stored in the control unit.

11. The method of claim 9, wherein when the flash memory device is rebooted, the parameters are stored in the control unit.

* * * * *